United States Patent
Trinks et al.

(10) Patent No.: US 7,981,246 B2
(45) Date of Patent: Jul. 19, 2011

(54) METHOD AND DEVICE FOR DETACHING A COMPONENT WHICH IS ATTACHED TO A FLEXIBLE FILM

(75) Inventors: Joachim Trinks, Flawil (CH); Andreas Marte, Steinach (CH); Wolfgang Herbst, Konstanz (DE)

(73) Assignee: Kulicke and Soffa Die Bonding GmbH, Berg (CH)

( * ) Notice: Subject to any disclaimer, the term of this patent is extended or adjusted under 35 U.S.C. 154(b) by 606 days.

(21) Appl. No.: 11/596,645

(22) PCT Filed: Dec. 17, 2004

(86) PCT No.: PCT/EP2004/053593
§ 371 (c)(1),
(2), (4) Date: Aug. 9, 2010

(87) PCT Pub. No.: WO2005/117072
PCT Pub. Date: Dec. 8, 2005

(65) Prior Publication Data
US 2007/0277929 A1  Dec. 6, 2007

(30) Foreign Application Priority Data
May 19, 2004 (CH) .................................... 869/04

(51) Int. Cl.
*B32B 38/10* (2006.01)
*H01L 21/46* (2006.01)
(52) U.S. Cl. ......... 156/344; 156/584; 438/464; 438/976
(58) Field of Classification Search ................... 156/344, 156/584; 438/464, 976
See application file for complete search history.

(56) References Cited

U.S. PATENT DOCUMENTS

| 4,556,362 | A | * | 12/1985 | Bahnck et al. | ............. | 414/744.3 |
|---|---|---|---|---|---|---|
| 4,778,326 | A | | 10/1988 | Althouse et al. | | |
| 6,202,292 | B1 | | 3/2001 | Farnworth et al. | | |
| 6,352,073 | B1 | * | 3/2002 | Kurosawa et al. | ............. | 125/35 |
| 6,561,743 | B1 | | 5/2003 | Nakatsu | | |
| 7,306,695 | B2 | * | 12/2007 | Kasai | ............. | 156/344 |
| 2003/0075271 | A1 | * | 4/2003 | Yoshimoto et al. | ........... | 156/344 |
| 2009/0032186 | A1 | * | 2/2009 | Cheung et al. | ................ | 156/344 |

FOREIGN PATENT DOCUMENTS

| JP | 63228638 | | 9/1988 |
|---|---|---|---|
| JP | 3076139 | | 4/1991 |
| JP | 2000353710 | A * | 12/2000 |
| JP | 2001196443 | | 7/2001 |

* cited by examiner

*Primary Examiner* — Mark A Osele
(74) *Attorney, Agent, or Firm* — Christopher M. Spletzer, Sr.

(57) ABSTRACT

The invention relates to a film (2) which comprises a component (1) to be detached therefrom. Said film is placed in the area of the component on a detaching tool (5) that is provided with at least one supporting element (6) for the film, which extends in a plane of support (11). The film is sucked against the support element (6) and partially under the plane of support by exerting negative pressure. The area of the supporting element is provided with at least one surface section (8) which extends in the plane of support when the detaching process begins, and which can be displaced, once the component (1) is grasped by a suction tool (4), plane-parallel to the plane of support while the negative pressure is maintained. The invention allows to control the detaching process of the film in a controlled movement without damaging or displacing the component.

25 Claims, 7 Drawing Sheets

METHOD AND DEVICE FOR DETACHING A COMPONENT WHICH IS ATTACHED TO A FLEXIBLE FILM

CROSS REFERENCE TO RELATED APPLICATION

This application claims the benefit of International Application No. PCT/EP2004/053593 filed Dec. 17, 2004 which claims priority to Swiss Patent Application Number 00869/04 filed May 19, 2004, now Swiss Patent No. 697213, the contents of both of which are incorporated herein by reference.

The invention relates to a method for detaching a component bonded to a flexible film according to the preamble of claim 1. Such methods serve in particular in the processing of semiconductor chips for in quick succession removing a large number of chips from the wafer film and placing them onto a supporting surface.

In this connection, the semiconductor chips with the electronic circuits arranged thereon are beforehand separated individually from the silicon slice by sawing. The wafer is bonded onto the wafer film tensioned in a frame at the latest for the sawing process, the adhesion clearly having to be sufficiently great in order to prevent breaking out or chips being detached during the sawing process. On the other hand, the adhesion should be as low as possible when the individual chips are detached from the film in order to avoid excessive mechanical force action on the chip.

Methods and devices in which the detaching process is supported by needles or pushing means which can be pressed against the film are already known. According to another detaching method, the film is sucked into a supporting base with a large number of indentations, so that the area of adhesion to the components is made considerably smaller and the necessary detaching force can thus be reduced. Examples of such methods are described in U.S. Pat. No. 4,778,326 or U.S. Pat. No. 6,202,292. Lastly, a generically comparable method, in which a step is displaced laterally in the plane of the film, has also become known through U.S. Pat. No. 6,561,743. In this connection, the film is at the same time sucked onto a lower level of the step, so that the film is continuously removed from the component during the advance of the step.

US 2003/0075271 describes a method and device for detaching semiconductor elements in which a detaching tool has a number of circumferential contact elements arranged concentrically with one another which can be extended telescopically in turn, the semiconductor element being raised and the film being detached stepwise.

According to JP 2001-196443, the detaching tool has a suction surface which has a pyramid-like structure. This suction surface is surrounded by a plane support surface.

JP 63-228638 describes a detaching tool in which a pushing means with a smaller surface than the electronic component is pressed against the film from below. The holding device for gripping the component is of fork-like design and takes hold of the component in the edge region already detached from the film.

Finally, JP 3-76139 describes a detaching tool for a semiconductor element in which a detaching piston is combined with a needle, first the detaching piston being raised and then the needle being pushed through the film.

A problem in all the known methods is that they are only limitedly suitable for processing chips with a very small thickness of, for example, 0.05 mm. There is a risk of mechanical damage when the chip is lifted off with needles or pushing means. Uncontrolled sucking of the film into indentations can also lead to great bending forces on the chip and thus to permanent damage. In the case of the displaceable step according to U.S. Pat. No. 6,561,743, detachment from the film takes place continuously and thus asymmetrically, which can cause slight displacement to one side. Depending on chip size, moreover, a corresponding clearance for the displacement is required at the side, which can lead to space problems in the edge region of the wafer.

It is therefore an object of the invention to provide a method of the kind mentioned in the introduction which also makes it possible to detach components of very small thickness without loading these excessively. The method should moreover have a high degree of operational reliability and function as independently as possible of the film type used. According to the invention, this object is achieved with a method which has the features in claim 1.

The surface portion which can be displaced in a plane-parallel manner brings about very precise control of the film deformation under the action of the negative pressure for reduction of the adhesion area. Owing to the movement which preferably takes place at right angles to the support plane, complete symmetry of the detaching process can be achieved. The plane-parallel advance and return travel can be set exactly. The detaching process can thus be adapted to specific workpiece parameters such as, for example, to particular film qualities or component heights. In this connection, the speed of the detaching operation can also be controlled. In contrast to the known methods, the component is until final lifting-off held clamped in every sequence of detachment either between the holding surface of the holding tool and the surface portion or between the holding surface and the supporting element. Such preferably planar support on both sides at every moment is especially important in the case of very thin chips.

For final lifting-off, the surface portion is pulled back out of the support plane into a detaching position while the holding tool secures the component. In this connection, the surface portion covers a defined travel at an adjustable speed and moves away from the film underside. Under the vacuum action, the film follows the control surface portion and in doing so is detached from the underside of the component, which is then only supported by the supporting element. The component can then be freed from the connection still maintained by the supporting element, for which only a small expenditure of force is necessary.

According to a slightly modified method, the surface portion can first be advanced out of the support plane and beyond the support plane simultaneously with the holding tool and then returned into the support plane again. During this displacement movement, the component is supported over a large area and held securely and stably between the holding tool and the surface portion. During the advance of the surface portion, the detaching operation of the film is started along the edge in a gentle way depending on the configuration of the surface portion. For this, it is advantageous if the surface portion or the sum of the surface portions has a slightly smaller area than the component. During the return, the surface portion continues its movement until it has again reached the detaching position mentioned in the introduction.

Depending on the size of the component, a number of surface portions spaced from one another can be moved simultaneously in such a way that a supporting element is arranged at least between two surface portions. In this connection, the movable surface portions are passed through by the supporting element, so that optimally distributed support of the component on the underside of the film is ensured in every sequence.

In certain applications, it can be advantageous to move a number of surface portions independently of one another.

The support of the film on the supporting element is preferably effected in punctiform and/or linear fashion, depending on the size and configuration of the component.

Further advantages can be achieved if the component is supported on at least 50% of its area by the surface portion or by the surface portions at least at the beginning of the detaching operation. Such support over a large area is important in particular when the component is first raised out of the support plane, the purpose being edge detachment.

In particular applications, it is advantageous if the surface portion is heated. In this way, heat can be transmitted to the chip or to the wafer film. In this connection, temperature-control is process-dependent in each case.

The invention also relates to a device according to the preamble of claim 10. On the one hand, this device is to allow the method mentioned in the introduction to be carried out in a simple way. Moreover, the device is to be capable if possible of being installed in existing processing machines, in particular in existing die bonders. According to the invention, this object is achieved with a device which has the features in claim 10.

The movably mounted control element with the surface portion which can be displaced in a plane-parallel manner can be combined particularly simply with the same drive system as may already be present for conventional detaching needles. In this connection, the control element can be capable of being both pulled back and advanced relative to the support plane. In the case of very small chips, it may be sufficient if the control surface has at least one plane surface portion, next to which at least one supporting element is arranged in a suitable way. Advantageously, however, there are a number of support elements which surround the surface portion at a suitable distance from one another and from the surface portion. By virtue of the fact that the control surface has a number of plane surface portions spaced from one another, support over a large area on the underside of the film is ensured. If a supporting element is arranged at least between two surface portions, very extensive support of the component is ensured even when the surface portions have been pulled back below the support plane.

Depending on the geometry of the component, the control element can have a number of firmly interconnected surface portions. In this connection, it is especially advantageous if the control element is monolithic, so that all the surface portions can be machined together and consequently also lie exactly in the same plane.

However, the control element can also have a number of surface portions which can be moved independently of one another and can be moved in a laterally staggered manner in relation to one another via a corresponding mechanism.

The support element can have supporting pyramids or supporting cones for punctiform support of the film or supporting strips for linear support of the film.

It is moreover especially advantageous if at least four surface portions are arranged next to one another in a matrix-like manner. In this arrangement resembling a cloverleaf, the support element can have a large number of supporting pyramids or supporting cones which are likewise arranged in a matrix-like manner around the surface portions. Alternatively, supporting strips forming a cross could also be arranged between the four surface portions.

The control surface or the individual surface portions can be heatable by means of a heating device in order to heat the wafer film or the individual chip. The heating device can be an electric resistance heating system or another heating element. The heating device can moreover have suitable control means for temperature control.

Further individual features and advantages of the invention emerge from the following description of illustrative embodiments and from the drawings, in which.

Figure 1:
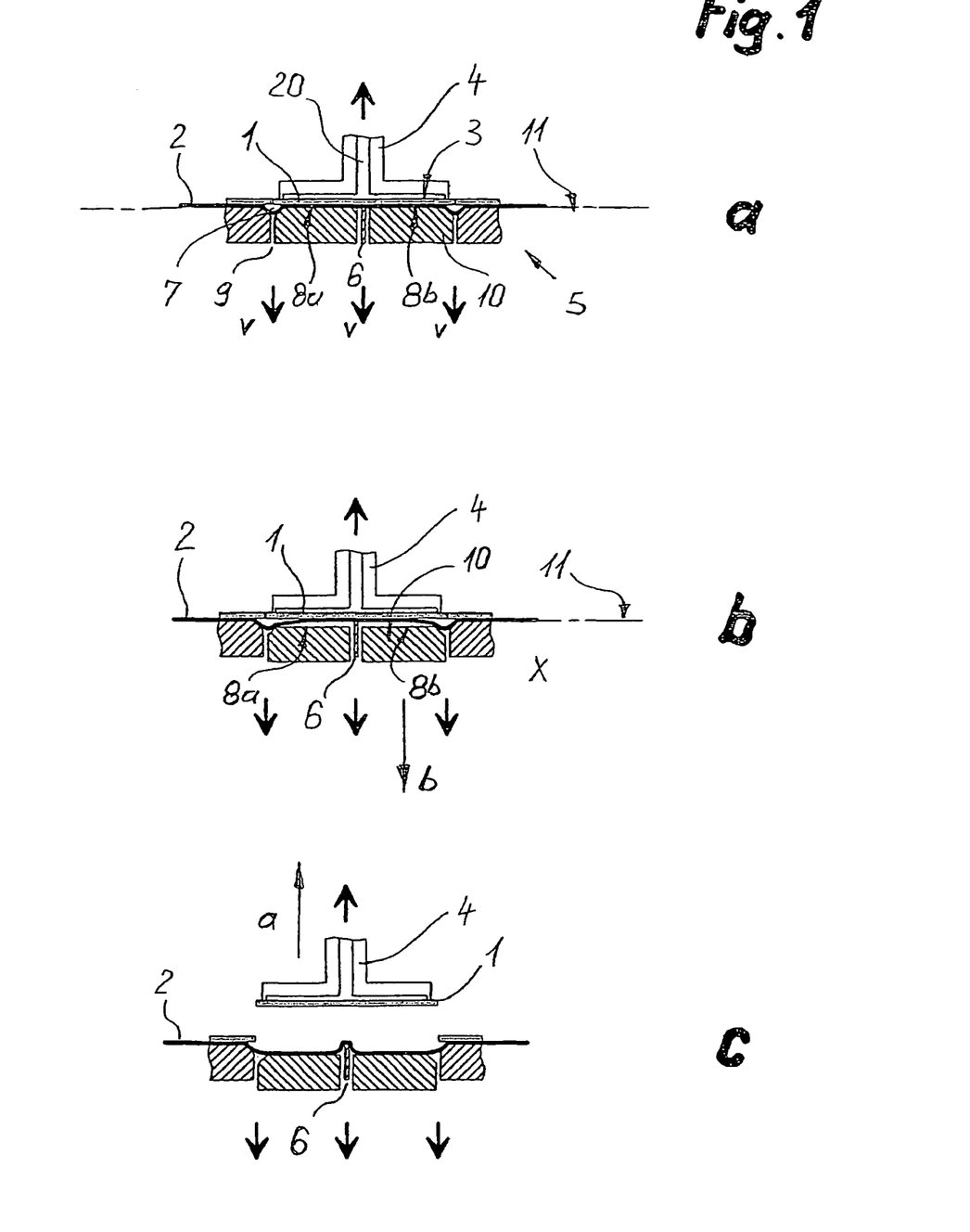
FIG. 1 shows a first example of a detaching operation according to the invention in three sequences.

FIGS. 1a to 1c show a first illustrative embodiment of a detaching operation in three sequences. In this connection, a large number of chips 1 are bonded on a tensioned wafer film 2, or the continuous wafer originally bonded on has been subdivided into individual chips by sawing. After sawing, the film is tensioned further in a known manner in order to facilitate individual separation of the chips. The detaching tool designated as a whole by 5 is illustrated only diagrammatically here. It is arranged in a stationary manner in a machine relative to the wafer film 2. The positioning of the chip 1 over the detaching tool 5 is effected via an X/Y coordinate drive.

A holding tool 4 with a plane holding surface with a suction function can be applied to that surface 3 of the chip facing away from the film. A negative pressure is applied to this surface via a negative pressure duct 20, so that the chip adheres to the holding tool 4. The holding tool 4 can be raised in arrow direction a (FIG. 1c), while the negative pressure is maintained, and transports the chip onto a substrate or to an intermediate station.

The detaching tool 5 has at least one supporting element 6, which lies in a support plane 11. The wafer film 2 lies on this support plane at the beginning of the detaching operation. A number of surface portions 8a, 8b arranged at the end of a control element 10 preferably also extend in the support plane 11 in direct proximity to the support element 6. The surface portions or the control element 10 can be pulled back in arrow direction b (FIG. 1b), where direction b is illustrated as being substantially perpendicular to support plane 11.

Throughout the detaching operation, a negative pressure (arrows v) is present in the region of the detaching tool 5 on the underside of the wafer film 2. This can act on the film via special negative pressure ducts 9 or simply via the clearance between the fixed and movable parts. In the edge region of the surface portions 8, indentations 7 can be formed, for example by appropriate bevels, at which the detaching process can be initiated under the action of the negative pressure.

Such a starting phase is illustrated in FIG. 1a. The indentations 7 extend not only in the edge region of the surface portions 8a, 8b but also in the edge region of the chip 1. Under the action of the negative pressure, they bring about a locally very limited deformation of the wafer film 2 and thus its detachment from the chip 1.

In a following step according to FIG. 1b, the surface portions 8a, 8b are pulled back in arrow direction b relative to the support plane 11. The wafer film 2 follows this movement continuously and remains in the support plane 11 only in the region of the support by the supporting element 6. In this connection, the detachment speed can be controlled precisely by means of the movement of the surface portions. The holding tool 4 holds the chip 1 stationary in the starting position.

Only when, according to FIG. 1c, the wafer film 2 has achieved its complete deformation and rests only on the supporting element 6, or adheres to the chip 1 in the region of this support, does lifting-off of the chip in arrow direction a with the aid of the holding tool 4 begin. After lifting-off, atmospheric pressure is re-established below the wafer film, and the film is displaced for the lifting-off of the next chip.

Figure 2:
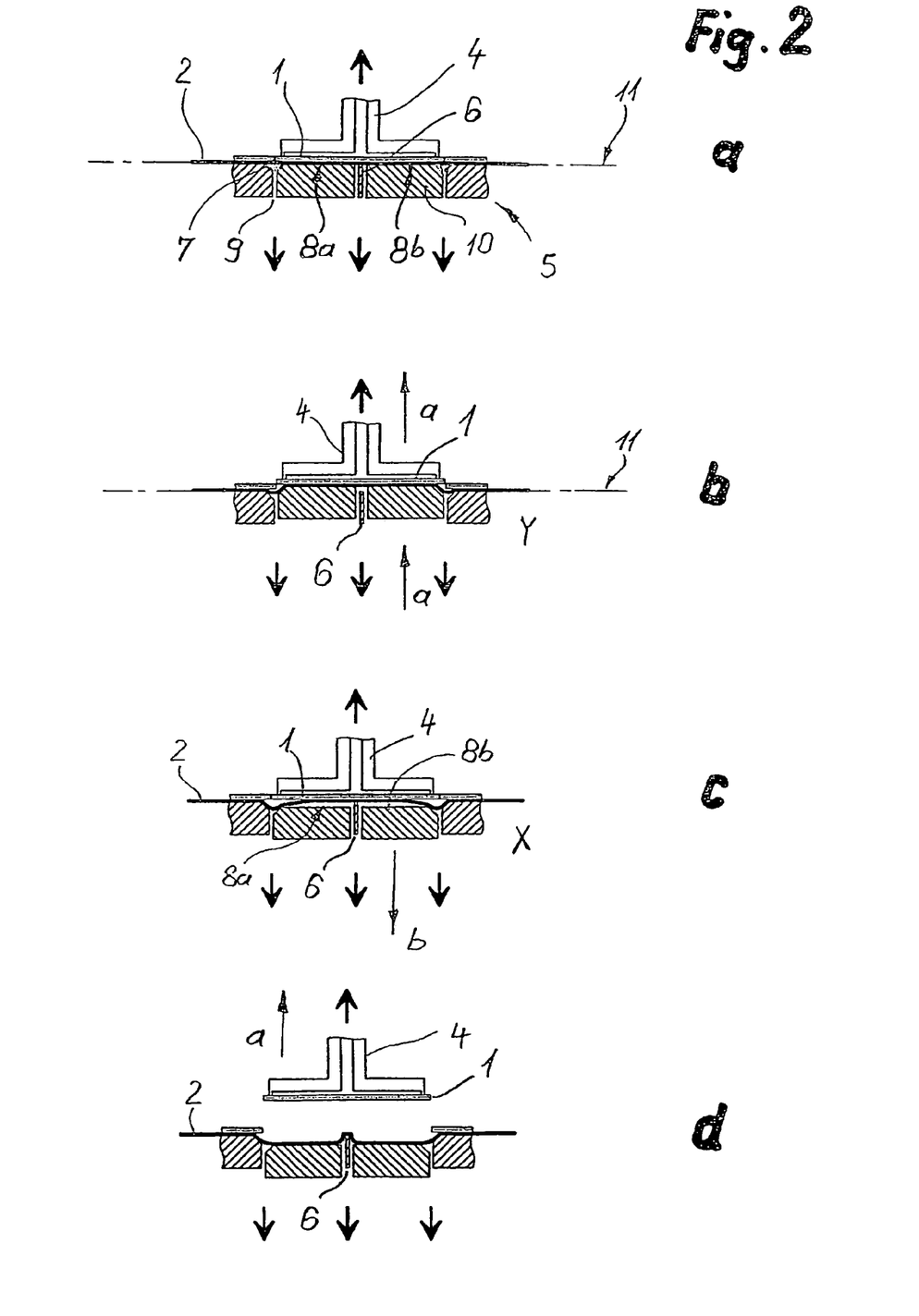
FIG. 2 shows a second example of a detaching operation according to the invention in four sequences.

A slightly modified detaching method is illustrated in FIGS. 2a to 2d. In this connection, FIG. 2a corresponds partly to the starting situation according to FIG. 1a. However, the film 2 is tensioned flat over the indentations 7, so that the detaching process does not start yet at this location. Moreover, FIGS. 2c and 2d in the end phase of the detaching operation correspond to the situations according to FIGS. 1b and 1c. However, to initiate the detaching process, a further step according to FIG. 2b is interposed. In this connection, the surface portions 8a, 8b are advanced a short distance in arrow direction a simultaneously with the holding tool 4, so that the chip 1 to be detached first rises above the support plane 11. This minimal offset starts the detaching operation in the edge region of the chip 1 in a gentle way. The holding tool 4 is then lowered synchronously with the surface portions 8a, 8b again until the film 2 rests on the support 6 again. The surface portions 8a, 8b continue their movement according to FIG. 2c in arrow direction b (where arrow direction a in FIG. 2b, and arrow direction b in FIG. 2c, are illustrated as being substantially perpendicular to support plane 11), whereupon the rest of the detaching operation takes place as in FIG. 1.

In the case of both detaching operations according to FIG. 1 and FIG. 2, the chip 1 is in any case first taken hold of with the aid of the holding tool 4 before the surface portions 8a and 8b move upward or downward. By virtue of this, the chip is gripped in a clamped manner between the holding surface of the holding tool and the surface portions 8a, 8b or the supporting element 6 before any tensile or bending forces at all act on the film 2. When the surface portions 8a, 8b are raised according to FIG. 2, this clamping retention is maintained.

Figure 3:
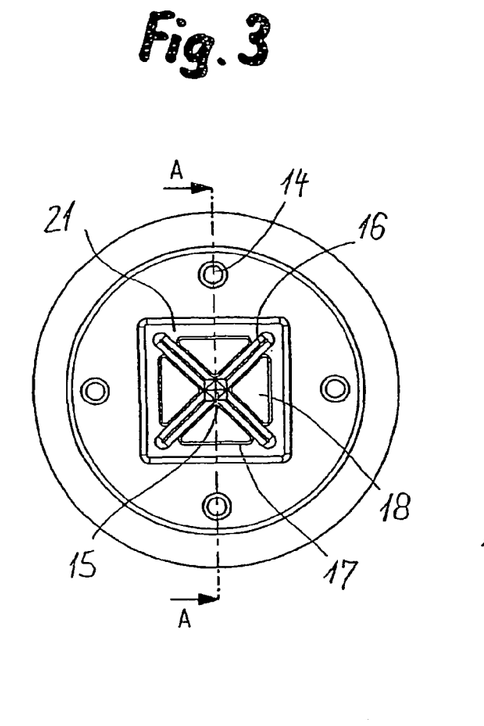
FIG. 3 shows a top view of the end side of a first detaching tool according to the invention.
Figure 4:
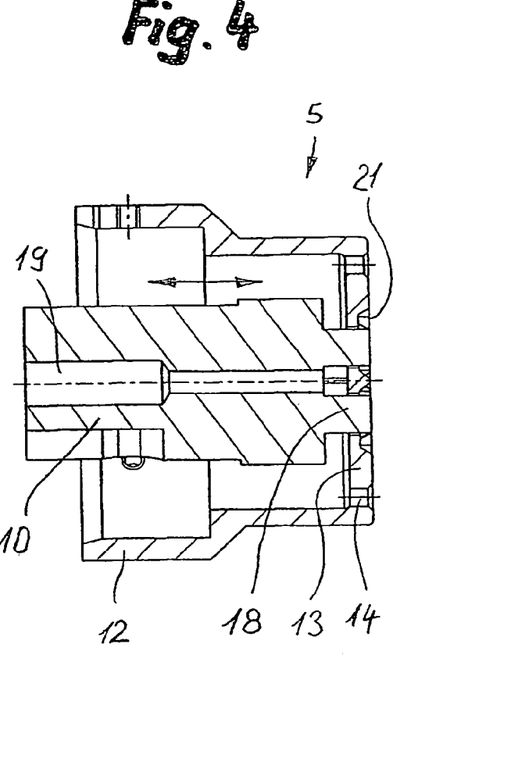
FIG. 4 shows a cross section through the plane A-A according to FIG. 3.
Figure 5:
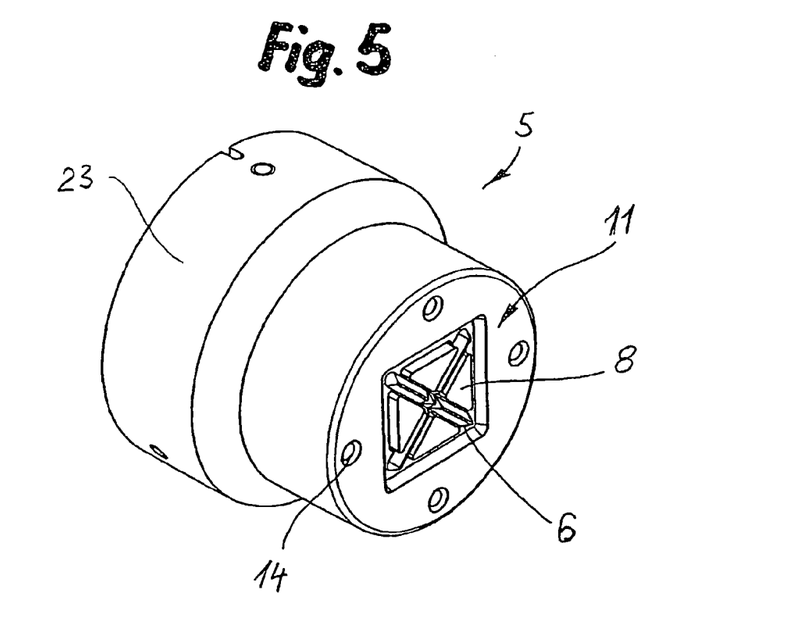
FIG. 5 shows a perspective illustration of the detaching tool according to FIGS. 3 and 4.

FIGS. 3 to 5 illustrate a detaching tool 5 such as can be used for the methods described above. The tool consists of a pot-like housing 23 with a hollow cylindrical fastening cuff 12 and with a support surface 13 on which the film comes to lie in the surrounding region of the chip to be detached. The entire interior of the fastening cuff can be connected to a negative pressure source. With this, a negative pressure of 200 mbar absolute in relation to atmospheric pressure can be achieved, for example. A total of four suction bores 14, via which the wafer film is fixed, are arranged at regular angular spacing on the circular support surface 13.

An approximately square depression 21 is arranged in the support surface 13. Four approximately triangular pusher openings 17 are provided in a cloverleaf-like arrangement within this depression. A supporting strip cross 16 extends between these pusher openings, and a supporting pyramid 15 is arranged at the intersection point. Supporting pyramid and supporting strip cross together form the supporting element 6 which extends in the support plane 11.

An approximately cylindrical control element 10 is held axially movably in the center and coaxially with the fastening cuff 12. Four individual pushers 18, the configuration of which in the support plane 11 corresponds to the configuration of the pusher openings 17, are arranged at one end of this control element. The pushers 18 each have at their ends a surface portion 8 and they pass through the pusher openings 17 with play, so that the negative pressure can act on the wafer film lying over the indentation 21 along their side walls as well. For this purpose, a suction bore 19 can also be arranged in the center of the control element 10.

In the present illustrative embodiment, the outline of the chip to be detached is slightly larger than that of the pusher arrangement designed in one piece. Support is effected via the diagonals of the chip and in the center.

Figure 6:
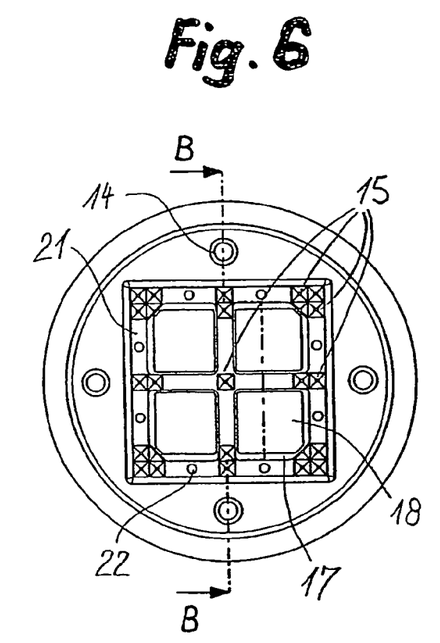
FIG. 6 shows a top view of the end side of a second detaching tool according to the invention.
Figure 7:
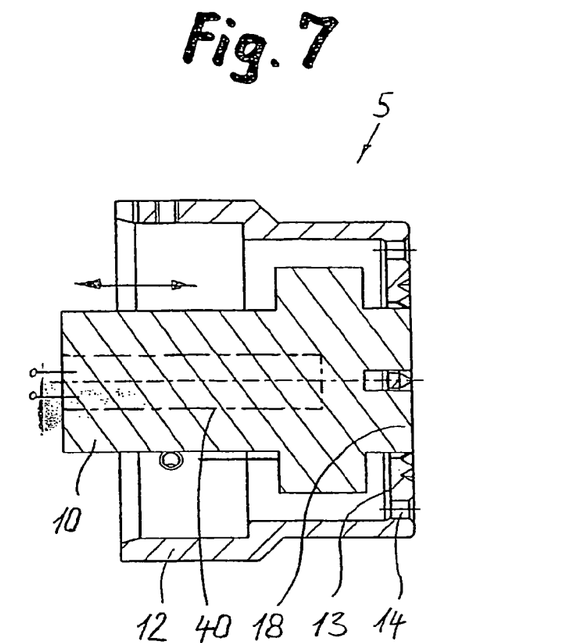
FIG. 7 shows a cross section through the plane B-B according to FIG. 6.
Figure 8:
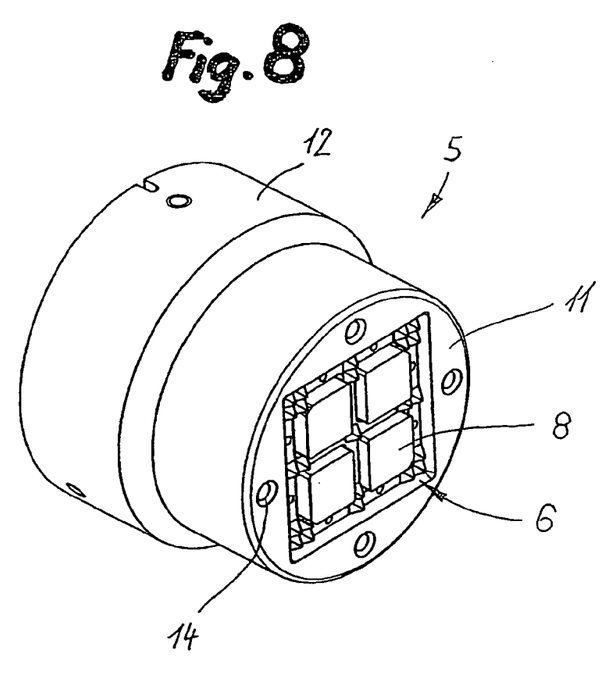
FIG. 8 shows a perspective illustration of the detaching tool according to FIGS. 6 and 7.

In the detaching tool according to FIGS. 6 to 8, the fastening cuff 12 is essentially of similar design to in the previous illustrative embodiment. The suction bores 14 in the support surface 13 are also arranged identically. However, the configuration of the support surface itself and also of the control element 10 is different. It is true that a square depression 21 is provided here as well, but the support element 6 is formed exclusively by supporting pyramids 15 which are arranged in a matrix-like manner in each case in the corner region, in the center of each side edge and in the center. The pyramids are connected via cross members (similar to strip cross 16 in FIGS. 3-5) such that the certain of the pyramids and cross members define the periphery of the control surface including surface portions 8. A total of four, likewise approximately square pusher openings 17 are arranged in the bottom of the depression 21. Pusher openings 17 are defined by peripheral support points (support pyramids 15) and the connecting cross members. Additional bores 22 for better distribution of the negative pressure can be provided in the edge region.

The control surface, or the individual surface portions, can be heated by means of a heating device 40, which is indicated here as an electric heating cartridge.

The control element 10 likewise has four pushers 18, the configuration of which corresponds approximately to that of the pusher openings.

In this illustrative embodiment, the wafer film is supported exclusively in punctiform fashion in the region of the bonded-on chip. Otherwise, however, the functioning of the detaching tool is the same as in the illustrative embodiment described previously.

Figure 9:
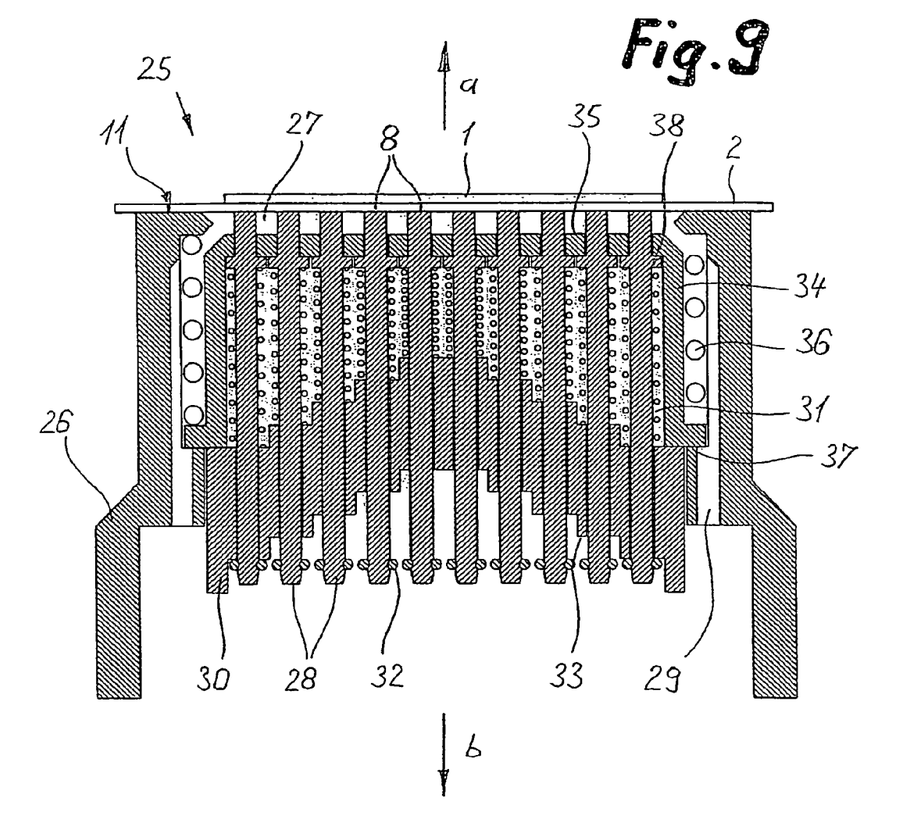
FIG. 9 shows a cross section through a further example of a detaching tool with a number of independently movable surface portions.

Lastly, FIG. 9 shows another modified illustrative embodiment of a detaching tool 25. This has a housing 26 in which a number of individual pushers 28 are mounted axially displaceably, possibly in a matrix-like manner. The individual pushers are mounted both in a control slide 30 and in an advance element 34. The advance element is of pot-like design similarly to the housing 26 and has an end side 35 which lies set back slightly below a housing opening 27. Openings, through which the individual pushers 28 pass, are arranged in the end side 35.

The advance element 34 is prestressed against a support 37 on the housing 26 under the action of a helical compression spring 36. On the other hand, the control slide 30 can be lowered further in arrow direction b. The control slide 30 has a step arrangement 33 with different levels, where in each case two or more individual pushers can be arranged at the same step arrangement level. At the upper end, the individual pushers each have a stop 38 which limits the upward movement of the pushers. At the lower end, the individual pushers are each provided with a driver element 32, all the driver elements lying at the same level in the neutral starting position illustrated. The individual pushers are each prestressed with a helical compression spring 31 between the stops 38 and the step arrangement 33.

The negative pressure necessary for the detaching process can act on the wafer film 2 via negative pressure ducts 29. However, additional ducts, in the individual pushers 28 for example, would be possible.

In the neutral starting position illustrated, the control surface portions 8 of the individual pushers all lie in the support plane 11. The special feature of this illustrative embodiment is that the surface portions 8 take on the function of a support at the same time. That is to say that no rigid support relative to the surface portions 8 is present in the support plane 11.

When the control side 30 is displaced in arrow direction a, the advance element 34 is clearly raised counter to the force of the helical compression spring 36, and the individual pushers or their surface portions 8 are advanced through the opening 27 beyond the support plane 11. In this connection, the force of the helical compression springs 31 is sufficient to hold the stops 38 in the stop position. However, if the control slide 30 is pulled back in arrow direction b, the two outermost individual pushers are clearly pulled back first via the step arrangement 33. Further pushers then follow them in pairs from the outside to the inside until finally the two innermost pushers are pulled back. In the case of a matrix-like arrangement of the pushers, pusher rows are in each case pulled back concentrically from the outside to the inside. This guided pulling-back movement brings about continuous detachment of the film from the outside to the inside in a guided and supported movement. Detachment is effected entirely symmetrically, so that no displacement of the chip can take place.

Figure 10:
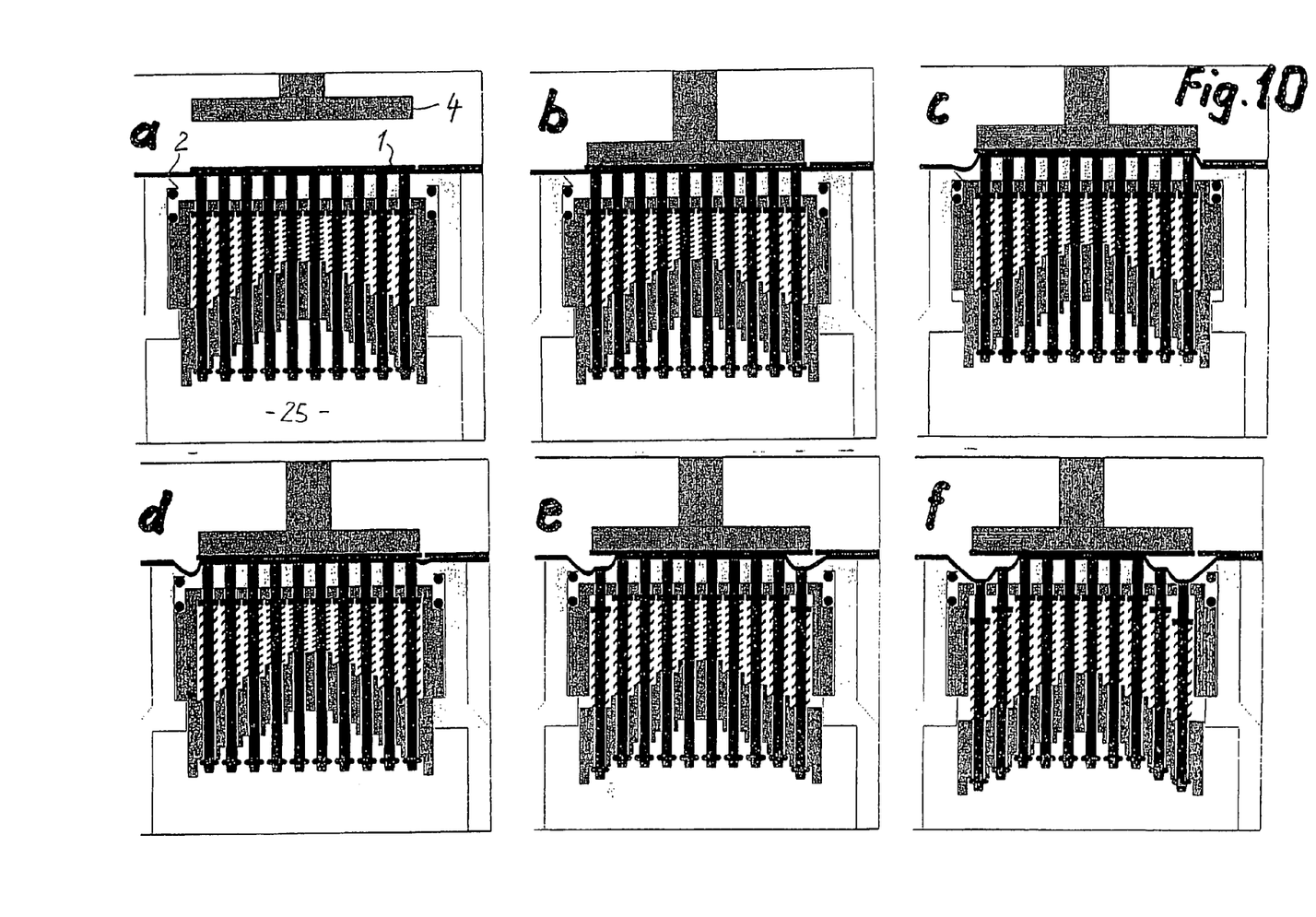
FIG. 10 shows a detaching operation with a detaching tool according to FIG. 9 in the sequences a to k.

FIG. 10 illustrates a detachment sequence using the detaching tool 25 according to FIG. 9 in the individual illustrations a) to k). In this connection, a) shows the neutral starting position after the wafer film has been positioned over the detaching tool and before the holding tool 4 takes hold of the chip 1.

According to b), the holding tool takes hold of the chip, and the underside of the wafer film 2 is placed under vacuum.

Then, according to c), the control slide 30 is advanced, the surface portions 8 being raised simultaneously with the holding tool 4. At the same time, the wafer film 2 is sucked slightly below the support plane 11. The detaching process already begins now along the outer edges of the chip 1.

Then, according to d), the control slide 30 is returned again, so that the chip 1 returns into the starting position again. All the individual pushers now have primarily the function of support for the wafer film. However, this remains in detached position along the edges.

According to e), the control slide is pulled back further, the two outermost pushers being taken along with it and lowered. Under the action of the negative pressure, the wafer film follows in a guided movement and is detached from the underside of the chip. According to f), g) and h), further pulling-back sequences of the pushers follow from the outside to the inside until finally only the two innermost pushers serve as support.

According to i), the innermost pushers are finally also lowered below the support plane 11, so that the detaching process is ended without the holding tool 4 having to be moved.

Only now, according to k), does the raising of the holding tool 4 and the pressure compensation take place, so that the elastic wafer film 2 relaxes again. The individual pushers can now be pushed back into the starting position according to a), and the wafer film can be positioned over the detaching tool for detaching a new chip. Modifications of the detaching tool according to FIG. 9 would of course be possible. In particular the pusher arrangement and the pulling-back sequences could in each case be adapted to the particular conditions. It would also be possible still to provide individual rigid supports or supporting elements, which could likewise be arranged in a matrix-like manner, between the movable pushers.

What is claimed:

1. A method for detaching a component bonded to a flexible film, in particular a semiconductor chip bonded to a wafer film, the component being, on its surface facing away from the film, taken hold of by a holding tool on a plane holding surface and lifted off from the film, the film being, in the region of the component, positioned on a detaching tool in such a way that it lies in a support plane and is supported in the support plane by at least one supporting element, and the film being sucked by means of negative pressure both against the supporting element and partly below the support plane, and furthermore at least one control element with a control surface being provided, which, before the lifting-off of the component from the film, the control element is moved in a direction substantially perpendicular to the support plane while the negative pressure is maintained, wherein the film lies on the control surface on at least one plane surface portion and in that the component is first taken hold of by the holding tool and is until lifting-off held clamped in every sequence of detachment either between the holding surface and the surface portion or between the holding surface and the supporting element, wherein the surface portion is first advanced out of the support plane and beyond the support plane simultaneously with the holding tool and returned into the support plane again, in that the surface portion is then pulled back out of the support plane into a detaching position while the holding tool secures the component and in that lastly the component is freed from the connection to the film still maintained by the supporting element.

2. The method of claim 1, wherein a number of surface portions spaced from one another are moved simultaneously in such a way that a supporting element is arranged at least between two surface portions.

3. The method of claim 1, wherein the support of the film on the supporting element is effected in punctiform and/or linear fashion.

4. The method of claim 1, wherein the component is supported on at least 50% of its area by the surface portion at least at the beginning of the detaching operation.

5. The method of claim 1, wherein the surface portion is heated by a heating device.

6. The method of claim 1, wherein the control surface or the surface portion extends approximately in the support plane at the beginning of the detaching operation.

7. The method of claim 1, wherein a number of surface portions are moved independently of one another.

8. A device for detaching a component bonded to a flexible film, in particular a semiconductor chip bonded to a wafer film, with a holding device for taking hold of the component on its surface facing away from the film and for lifting-off from the film, with a detaching tool on which the film can be positioned in the region of the component in such a way that it lies in a support plane and can be supported in the support plane by at least one supporting element, and also with at least one negative pressure duct opening toward the support plane, at least one control element with a control surface being movably mounted in the detaching tool in such a way that the control surface can be displaced out of the support plane when the at least one control element is moved in a direction substantially perpendicular to the support plane, wherein the control surface includes a plurality of plane surface portions next to which the at least one supporting element is arranged, the supporting element comprises a plurality of points that define a planar periphery of the control surface, the supporting element also including a plurality of cross members such that the points and the cross members define a plurality of openings, wherein the plane surface portions move through the plurality of openings in the direction substantially perpendicular to the support plane.

9. The device of claim 8, wherein the surface portion can be pulled back out of the support plane into a detaching position at a distance from the support plane.

10. The device of claim 8 wherein the surface portion can be advanced beyond the support plane simultaneously with the holding tool.

11. The device of claim 8, wherein the surface portions are spaced from one another and in that a portion of the supporting element is arranged at least between two surface portions.

12. The device of claim 11, wherein the surface portions are firmly interconnected.

13. The device of claim 11, wherein the surface portions can be moved independently of one another.

14. The device of claim 12, wherein at least four surface portions are arranged next to one another in a matrix-like manner.

15. The device of claim 8, wherein the points of the supporting element are punctiform points, and the cross members are linear supports for the film.

16. The device of claim 15, wherein the points of the supporting element has are supporting pyramids or supporting cones which are arranged in a matrix-like manner around the surface portions.

17. The device of claim 8, wherein the control surface can be heated by means of a heating device.

18. A device for detaching a component bonded to a flexible film, in particular a semiconductor chip bonded to a wafer film, with a holding device for taking hold of the component on its surface facing away from the film and for lifting-off from the film, with a detaching tool on which the film can be positioned in the region of the component in such a way that it lies in a support plane and can be supported in the support plane by at least one supporting element, and also with at least one negative pressure duct opening toward the support plane, at least one control element with a control surface being movably mounted in the detaching tool in such a way that the control surface can be displaced out of the support plane when the control element is moved in a direction substantially perpendicular to the support plane, wherein the control surface has at least one plane surface portion next to which at least one supporting element is arranged, wherein the supporting element has punctiform and/or linear supports for the film, and wherein the supporting element has a large number of supporting pyramids or supporting cones which are arranged in a matrix-like manner around the surface portion or the surface portions.

19. The device of claim 16, wherein the surface portion can be pulled back out of the support plane into a detaching position at a distance from the support plane.

20. The device of claim 16 wherein the surface portion can be advanced beyond the support plane simultaneously with the holding tool.

21. The device of claim 16, wherein the control surface has a number of surface portions spaced from one another and in that a supporting element is arranged at least between two surface portions.

22. The device of claim 21, wherein the surface portions are firmly interconnected.

23. The device of claim 21, wherein the surface portions can be moved independently of one another.

24. The device of claim 22, wherein at least four surface portions are arranged next to one another in a matrix-like manner.

25. The device of claim 18, wherein the control surface can be heated by means of a heating device.

* * * * *